United States Patent [19]

Cranston

[11] 3,805,120

[45] Apr. 16, 1974

[54] EXPLOSIVE BONDING OF WORKPIECES

[75] Inventor: Benjamin Howell Cranston, Trenton, N.J.

[73] Assignee: Western Electric Company, Incorporated, New York, N.Y.

[22] Filed: Nov. 26, 1971

[21] Appl. No.: 202,567

Related U.S. Application Data

[60] Division of Ser. No. 68,431, Aug. 31, 1970, Pat. No. 3,727,296, which is a continuation-in-part of Ser. No. 6,829, Jan. 29, 1970, abandoned.

[52] U.S. Cl. .. 317/234 R, 174/DIG. 3, 317/101 CC

[51] Int. Cl. .............................................. H01l 1/14

[58] Field of Search... 102/DIG. 2; 29/421 E, 470.2; 339/275 E, 276 K; 174/52 R, 185, DIG. 3; 317/101 CC, 101 CM, 101 A

[56] References Cited

UNITED STATES PATENTS

| | | | |
|---|---|---|---|
| 2,909,758 | 10/1959 | Modrey | 29/470.2 X |
| 3,543,388 | 12/1970 | Blank et al. | 29/470.2 X |
| 3,233,312 | 2/1966 | Cowan et al. | 29/470.2 X |
| 3,316,458 | 4/1967 | Jenny | 174/DIG. 3 UX |
| 3,380,908 | 4/1968 | Ono et al. | 29/470.2 UX |
| 3,440,027 | 4/1969 | Hugle | 174/DIG. 3 UX |

*Primary Examiner*—Darrell L. Clay
*Attorney, Agent, or Firm*—Bryan W. Sheffield

[57] ABSTRACT

An article of manufacture comprising a beam-leaded semiconductor device. Each beam lead has a quantity of explosive material deposited thereon to facilitate the subsequent explosive bonding of the device to a suitable substrate. The preferred explosive is lead azide and in some embodiments, the beam leads have an undulating or castellated surface to increase the adhesion of the explosive bond.

6 Claims, 6 Drawing Figures

EXPLOSIVE BONDING OF WORKPIECES

This is a division, of application, Ser. No. 68,431 filed Aug. 31, 1970 now U.S. Pat. No. 3,727,296, which issued on Apr. 17, 1973, which in turn is a continuation-in-part of application, Ser. No. 6,829, filed Jan. 29, 1970, now abandoned.

BACKGROUND OF THE INVENTION

1. Field of the Invention

Broadly speaking, this invention relates to explosive bonding. More particularly, in a preferred embodiment, this invention relates to a method of explosively bonding a first workpiece to a second workpiece.

2. Description of the Prior Art

In the manufacture of electronic circuitry, the use of discrete electrical components, such as resistors, capacitors, and transistors, is rapidly becoming obsolete. These discrete components are largely being supplanted by the integrated circuit, a small chip of silicon which, by a series of selected masking, etching, and processing steps, can be made to perform all of the functions which may be performed by discrete components when these discrete components are suitably interconnected by conventional or printed wiring to form an operating circuit.

Integrated circuit devices are very small, the dimensions of a typical device being approximately 0.035 inch × 0.035 inch. While these microscopic dimensions permit a heretofore undreamed of degree of miniaturization, there are other reasons why these devices are made as small as they are, one reason being that the microscopic dimensions significantly improve the operating characteristics of circuits which are fabricated on IC devices. For example, the switching speed of gating circuits and the bandwidth of I.F. amplifiers, are significantly improved by this miniaturization.

Of course, an integrated circuit cannot operate *in vacuo*, and must be interconnected to other integrated circuits and to the outside world, for example, to power supplies, input/output devices, and the like. Here, however, the microscopic dimensions are a distinct disadvantage.

Because of improved manufacturing techniques and increased yield, the cost of integrated circuits has dropped drastically in the last decade and now, in many instances, the cost of interconnecting an integrated circuit to another integrated circuit or to the outside world exceeds the cost of the device itself, a most undesirable situation.

In one prior art method of interconnecting integrated circuit devices, each device is bonded to the header of a multiterminal, transistor-like base. Fine gold wires are then hand bonded, one at a time, from the terminal portions of the integrated circuit to corresponding terminal pins on the transistor-like base, which pins, of course, extend up through the header for this purpose, in a well-known manner. Interconnection of the device to other devices or to the outside world is then made by plugging the base, with the integrated circuit device attached thereto, into a conventional transistor-like socket which is wired to other similar sockets, or to discrete components, by conventional wiring or by printed circuitry.

Because of the extremely small size of IC devices, and the attendant alignment problems, attempts to automate this uneconomical hand-bonding process have not proved to be successful. Further, apart from the economics, the use of plug-in integrated circuit devices vitiates many of the highly desirable properties possessed by such devices, for example, the compactness which may be realized and the improved circuit performance which they are capable of yielding.

For these reasons, circuit designers generally prefer to connect integrated circuits directly to an insulating substrate, such as glass or ceramic, upon which a suitable pattern of metallic, for example, aluminum or gold, conductor paths has been laid down. Unfortunately, most existing techniques for laying down metallic conductor paths on glass or ceramic are expensive and time consuming. Examples of these existing techniques include sputtering or vacuum depositing a thin metallic film on the substrate followed by the application of a photoresist over the metallic film so deposited. Next, the photoresist is exposed, through an appropriate mark, and developed and the metal film selectively etched away to leave the desired metallic pattern on the substrate. Finally, the metallic pattern is built up to the desired thickness by the electrolytic or electroless deposition technique in which additional metal is deposited onto the existing metallic pattern. An alternate technique, known in the art, for depositing conductive metallic paths on a substrate involves screening a granular suspension of metal particles in a suitable vehicle, such as ethyl cellulose, onto the substrate, in the desired pattern, and then firing the substrate to bind and diffuse the metal granules in the surface of the substrate to thereby create the desired pattern of conductive paths on the substrate. Because of the large number of steps involved, it will be self evident that these prior art techniques are expensive and time consuming.

Returning now to the problems of bonding the devices themselves, the above-described hand-bonding technique for integrated circuit devices may, of course, be used to connect an integrated circuit device to the terminal land areas of a printed conductor pattern. However, techniques which more readily lend themselves to automation have also been developed.

U.S. Pat. No. 3,425,252, for example, which, issued to M. J. Lepselter on Feb. 4, 1969, describes a semiconductor device including a plurality of beam-lead conductors cantilevered outward from the device. To bond such a beam-leaded device to a substrate, the device is first aligned with respect to the terminal land areas of the substrate and then heat and pressure are applied to each of the beam leads, by means of a suitably shaped bonding tool, to simultaneously and automatically bond the beam leads to the substrate.

Another bonding technique which may be used with beam-lead devices is the compliant bonding technique described in U.S. patent application, Ser. No. 651,411 of A. Coucoulas which was filed on July 6, 1967 now U.S. Pat. No. 3,533,155, which issued on Oct. 13, 1970. This application describes a bonding technique wherein heat and pressure are applied by a bonding tool to the beam leads through a compliant medium, such as a sheet of 2024 aluminum. The heat and pressure which is applied causes the aluminum sheet to flow plastically and to transmit the bonding pressure to the beam leads, thereby bonding the beam leads to the substrate.

The above-described techniques successfully permit the simultaneous bonding of all the beam leads of a single device, and, of course, are equally well suited for large area bonding, that is to say, the case where it is desired to simultaneously bond a plurality of beam-leaded devices to a single substrate. However, it is somewhat difficult to align a massive, multi-apertured bonding tool (or a plurality of closely spaced, individual bonding tools) with respect to the integrated circuit devices to be bonded. Yet another problem in large area bonding is that, while it is possible to closely control the dimensions of a given IC device and its alignment with respect to a given set of land areas on a substrate, it is very difficult to control the spacing between this set of land areas and another set of land areas at, say, the other end of the substrate. Since there is thus some uncertainty as to the exact location where each integrated circuit device will be found on the substrate, the use of a massive multi-apertured bonding tool (or a plurality of individual bonding tools) becomes difficult because of the variation in device-to-device spacing from one substrate to another.

Another reason why alternative techniques are desirable for use in large area bonding applications is the fact that it is not possible to manufacture large substrates which are substantially flat over the entire surface area of the substrate. There thus exists a substantial degree of nonparallelism between the substrate (and hence the IC devices to be bonded) and the bonding tool (or tools). This lack of parallelism may result in bonding pressures being applied to some IC devices which are far in excess of the maximum permitted pressure, resulting in damage to, or the complete destruction of, the affected devices. Similarly, the lack of parallelism may cause bonding pressures to be applied to other IC devices which are far below the minimum pressures required for satisfactory bonding, resulting in weak or non-existent bonds between the devices and the substrate.

Broadly speaking then, the problem is to find an improved method of bonding a first workpiece to a second workpiece. In particular, an important aspect of this problem is to find a method of simultaneously bonding the microleads of a plurality of integrated circuit devices to the corresponding land areas of a substrate, after the devices have been aligned with respect to the substrate, without using a bonding tool which must itself be aligned with respect to the devices and/or the substrate or which must be provided with a complicated compensating mechanism to compensate for lack of parallelism between the substrate and the bonding tool.

A second important aspect of this problem is to find a method of forming metallic conductive paths or regions on an insulating substrate, particularly a large area substrate, without subjecting the substrate to numerous expensive and time-consuming processing steps.

I have discovered that explosive bonding provides a highly satisfactory solution to the above-described problems. The use of high explosives for metal-working purposes dates, of course, from the turn of the century; however, serious research into this subject matter was not begun until the late forties and early fifties. Initially, research was concentrated on the use of high explosives to shape massive workpieces which could not be conveniently or economically worked by any other technique. More recently, however, research has been concentrated on explosive welding; the aircraft and aerospace industries, in particular, being extremely active in this area, as explosive welding is highly attractive to these industries because of the exotic nature of the metals and alloys employed therein.

Explosive metal cladding has also provided extremely successful and is used, for example, to produce the blank cupro-nickel/copper stock used by the Government to mint U.S. currency.

When compared to the dimensions of typical substrates and electronic components, the workpieces which are welded or clad by prior art explosive techniques are truly massive. For example, a typical prior art application might be to explosively clad a layer of 14 guage titanium to the surface of a cylindrical pressure vessel, 15 feet in diameter by 30 feet long, and which is fabricated from 4 inch thick steel. As another example of the massive workpieces handled by the prior art, in the previously discussed explosive cladding of cupro-nickel/copper stock, a 10 foot by 20 foot sheet of cupro-nickel, nine-tenths of an inch thick, is explosively clad to a correspondingly dimensioned sheet of copper, 3¾ inches thick, which in turn is explosively clad to a second nine-tenths inch thick sheet of cupro-nickel, to form the finished product.

By way of contrast, the miniature workpieces which are explosively bonded according to the methods of my invention are several magnitudes of order smaller. For example, a typical integrated circuit device may measure only 0.035 inch by 0.035 inch and the 16 or more beam leads to be bonded to the substrate are cantilevered outward from the device and may each measure only 0.0005 inch thick by 0.002 inch wide by 0.006 inch long. Further, typical ceramic or glass substrates may measure only 4 inch × 2 inch × 20 mils thick.

In prior art explosive bonding techniques, such as above described, the workpieces to be bonded are placed in proximity to each other and a sheet charge of high explosive, such as RDX (cyclotrimethylene trinitramine) is overlaid on the upper surface of one of the workpieces to be bonded. A commercial detonator is then implanted at one end of the sheet explosive, and ignited from a safe distance by means of an electrical spark. The detonator then explodes, setting off in turn an explosion in the sheet charge of RDX. The force created by this latter explosion accelerates the first workpiece towards the second workpiece to firmly bond them one to the other.

Because of the massive size of the workpieces used in the prior art, unwanted by-products of the explosion are not of particular concern; neither is contamination of the workpieces or damage to the workpiece surfaces. If a "clean" surface is required, the workpieces can easily be machined, sanded or buffed to the desired finish. Again by way of contrast, the miniature workpieces to be bonded by the methods of my invention, particularly electronic components such as integrated circuits, are extremely sensitive to contamination. Further, because of their extremely small size, buffing, sanding or polishing of these workpieces to smooth the surfaces thereof and remove impurities therefrom is impractical, if not impossible. In addition, substrates such as glass and ceramic are extremely brittle and tend to craze or crack when subjected to sudden concentrated stresses.

The use of a buffer layer which is positioned intermediate the sheet charge of explosive and the upper surface of one of the workpieces is known in the prior art.

However, in the prior art this buffer layer is not provided for the purpose of (and indeed would be inoperative for) protecting the surfaces of the workpieces from chemical contamination or reducing stress concentrations in the workpieces. Rather, in the prior art, these buffer layers are provided to modify the characteristics of the secondary explosive material and, in particular, to reduce the velocity of detonation.

In the case of massive workpieces of the type bonded by prior art explosive bonding techniques, as much as several hundred pounds of explosive may be required. Obviously, the explosion must be performed out of doors, under the most carefully controlled safety conditions.

While the exact mechanism by which explosive bonds are formed with workpieces and explosive charges of this size is not fully known, through trial and error, certain formulae have been developed relating the quantity of explosive required to produce a satisfactory bond under given conditions and workpiece dimensions. These formulae are, for the most part empirically derived, and, therefore, do not yield satisfactory results when applied to workpieces which are several orders of magnitude smaller.

An explosive may be defined as a chemical substance which undergoes a rapid chemical reaction, during which large quantities of gaseous by-products and much heat are generated. There are many such chemical compounds and, for convenience, they are divided into two main groups: low explosives, such as gun powder; and high explosives. The latter category may be further subdivided into initiating (or primary) explosives and secondary explosives. Primary explosives are highly sensitive chemical compounds which may easily be detonated by the application of heat, light, pressure, etc. thereto. Examples of primary explosives are the azides and the fulminates. Secondary explosives, on the other hand, generate more energy than primary explosives, when detonated, but are quite stable and relatively insensitive to heat, light, or pressure. In the prior art, primary explosives are used exclusively to initiate detonation in the higher energy, secondary explosives.

Strictly speaking, the difference between a low explosive, such as gun powder, and a high explosive, such as TNT, is in the manner in which the chemical reaction occurs. The fundamental difference is between burning (or deflagration) and detonation, not between the explosive substances themselves. It is quite common to find that an explosive can either deflagrate or detonate according to the method of initiation or the quantity of explosive involved. If the mass of explosive matter is small, thermal ignition thereof, as by an open flame, usually, if not always, leads to deflagration; but if the mass exceeds a certain critical value, it is possible for the burning to become so rapid that it sets up a shockwave front in the explosive material and detonation ensues. The critical mass varies from explosive to explosive, thus, for the primary explosive lead azide, the critical mass is too small to measure, whereas for TNT it is in the order of 2,000 pounds. Thus, the application of an open flame to a mass of TNT of, say, 1,800 pounds would not produce detonation but only deflagration. The application of the same open flame to 2,200 pounds of TNT, however, would produce an immediate detonation. Quantities of secondary explosive, therefore, which are smaller than the critical mass must be detonated by an intense shock, e.g., from the detonation of a primary explosive such as lead azide and are thus of no value for the bonding of miniature workpieces.

Prior to my invention, then, primary explosives were used exclusively for initiating detonation in secondary explosives such as TNT, dynamite and the like. Because the critical mass of such primary explosives is so small as to be unmeasurable, the empirical equations developed for the use of subcritical masses of secondary explosives are inapplicable. This is primarily due to the difference in the parameters, such as the detonation velocity, of the highly sensitive primary explosives, and the relatively insensitive secondary explosives. The detonation velocity of the primary explosive mercury fulminate, for example, is approximately 2,000 meters per second, whereas the detonation velocities of the secondary explosives TNT and nitroglycerin are approximately 6,000 meters per second and 8,000 meters per second, respectively. A more detailed discussion of the thermochemistry of explosives may be found in the publications entitled, "Detonation in Condensed Explosives," by J. Taylor, published by Oxford University Press, London, 1952 and "Explosive Working of Metals," by J. S. Rinehart and J. Pearson, published by Macmillan, New York, 1963.

SUMMARY OF THE INVENTION

Briefly, my invention comprises, in a first preferred embodiment, a method of bonding a first workpiece to a second workpiece. The method comprises the steps of: placing said first and second workpieces in juxtaposition to each other; and detonating a primary explosive in the region of the desired bond, the force created by the detonation of said primary explosive accelerating at least one of said workpieces towards the other, to thereby form an explosive bond between said workpieces.

Detonation of the explosive material is accomplished, in one embodiment of the invention, by applying heat to the workpiece. In other embodiments of the invention, detonation is accomplished by the application of light, laser, or acoustic energy to the explosive material. In still further embodiments of the invention, detonation is accomplished by means of alpha particles, shock waves, mechanical pressure, an electron beam, alternating magnetic or electric fields, an electric discharge or the provision (or removal) of a chemical atmosphere. In some embodiments of the invention, the bonding force is applied directly to the microcircuits to be bonded; in other embodiments, the bonding force is applied through a protective bonding medium.

Another embodiment of my invention comprises a method of bonding the microleads of at least one beam lead-like device to corresponding regions of a workpiece. The method comprises the stps of placing a charge of explosive material proximate each of the microleads to be bonded in a position to accelerate the microleads towards the workpiece and detonating the explosive material to explosively bond the microleads to corresponding regions of the workpiece. As before, the explosive material may be detonated by heat, light, sound, pressure, etc. and may be applied directly to the workpiece or through a protective buffer medium, such as stainless steel or a polyimide, such as KAPTON.

DETAILED DESCRIPTION OF THE INVENTION

Figure 1:
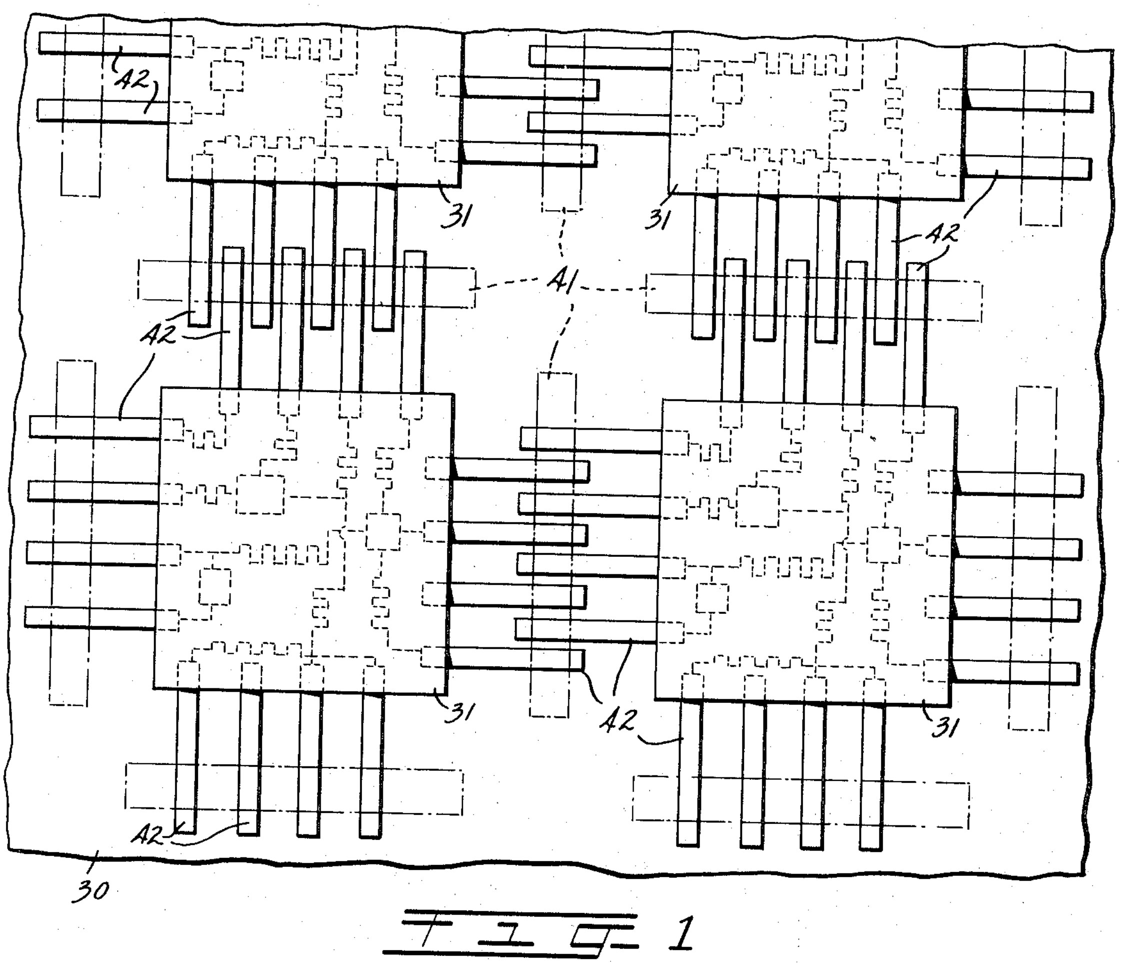
FIG. 1 is a partial top view of a plurality of beam-lead devices, prior to separation, and shows the manner in which explosive material is deposited thereon.

Referring to FIG. 1, each of the beam-leaded IC devices 31 to be bonded is provided with a plurality of gold beam leads 42 cantilevered outward therefrom. In accordance with standard manufacturing techniques for these devices, prior to separation, the beam leads of each device are interdigitated with the beam leads of its immediate neighbors.

While so interdigitated, a suitable explosive is overlaid on the beam leads, e.g., by screening through apertures 41 in a stencil.

Figure 2:
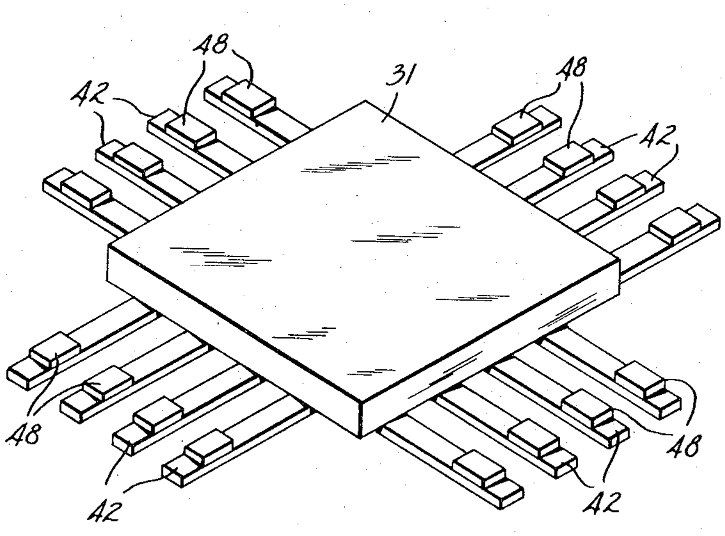
FIG. 2 is an isometric view of a single beam-lead device and shows the location of the explosive material on the microleads thereof in greater detail.

FIG. 2 illustrates the appearance of a beam-lead device after it has been coated with explosive material and separated from its neighboring devices. As can be seen, a small quantity of explosive material 48 has been deposited on each beam lead 42. It will be apparent that the quantity of explosive deposited, and hence the bonding force produced when the explosive is detonated, may be controlled by varying the width of the apertures in the stencil plate and/or by altering the thickness of the stencil plate, thereby affecting the amount (i.e., width and height) of explosive material deposited on the beam leads.

For some special applications, it may be desirable to deposit unequal amounts of explosive material on each beam lead. The above-described apparatus can easily accommodate this requirement by a combination of the above-described changes to the apertures of the stencil plate. Further, the apparatus may easily be adpated to handle different IC circuit configurations, or different substrate arrangements, by merely substituting an appropriately configured stencil plate. The apparatus can also handle an individual IC device, if so desired, by the use of a suitably dimensioned holder for the individual device. Advantageously, slotted apertures 41 in stencil 40 are arranged to deposit explosive material onto each beam lead no closer to the main part of the device than one-third of the length of the beam lead and no further from the device than two-thirds of the length of the beam lead. Advantageously, the average distance used in practice is approximately one-half of the length of a beam lead.

As previously discussed, in the bonding of miniature workpieces, the conventional use of a secondary high explosive, which is detonated by means of a detonator, is impossible. I have discovered, however, that primary explosives may be used to bond such miniature workpieces. Of the many known primary explosives, the azides and the fulminates are probably the most widely understood, although many other chemical compounds exhibit similar characteristics and may also be used for the explosive bonding of miniature workpieces. The choice of the particular primary explosive to be used in any given bonding application is a function of the amount of explosive force required and/or the manner in which it is desired to initiate detonation. Advantageously, the detonation of the primary explosive, in accordance with my invention, may be accomplished by the application of heat, light, sound, pressure, shock waves and the introduction (or removal) of a suitable chemical atmosphere. For example, if light is employed as the detonating mechanism, then silver nitride ($Ag_3N$) or cuprous azide ($Cu(N_3)_2$) may be used as the primary explosive. Alternatively, if detonation is accomplished by means of mechanical force and pressure, mercury fulminate ($C_2N_2O_2Hg$) or lead azide ($Pb(N_3)_2$) may be used as the primary explosive.

Table A, below, lists some of the more common azide compounds, together with their critical detonation temperatures.

TABLE A

THE MORE COMMON AZIDE EXPLOSIVES

| Compound | Formula | Critical Detonation Temp. °C. |
|---|---|---|
| Lead Azide | $Pb(N_3)_2$ | 350 |
| Silver Azide | $Ag(N_3)_2$ | 300 |
| Titanium Azide | $Ti\,N_3$ | 350 |
| Boron Azide | $B(N_3)_2$ | — |
| Silicon Azide | $Si(N_3)_4$ | — |
| Mercuric Azide | $Hg(N_3)_2$ | 460 |
| Copper Azide | $Cu(N_3)_2$ | 215 |
| Cadmium Azide | $Cd(N_3)_2$ | 144 |
| Ammonium Azide | $NH_4(N_3)$ | 170 |
| Mercurous Azide | $Hg_2(N_3)_2$ | 210 |

Table B, below, lists some of the more common fulminate compounds, together with their critical detonation temperatures.

TABLE B

THE MORE COMMON FULMINATE EXPLOSIVES

| Compound | Formula | Critical Detonation Temp. °C |
|---|---|---|
| Mercury Fulminate | $Hg(ONC)_2$ | 190 |
| Silver Fulminate | $Ag(ONC)_2$ | 170 |
| Copper Fulminate | $Cu(ONC)_2$ | — |

Table C, below lists some additional primary explosive compounds, together with their critical detonation temperatures.

TABLE C

MISCELLANEOUS PRIMARY EXPLOSIVES

| Compound | Formula | Critical Detonation Temp. °C |
|---|---|---|
| Mercuric Acetylide | $HgC_2$ | 260 |
| Mercurous Acetylide | $Hg_2C_2$ | 280 |
| Copper Acetylide | $CuC_2$ | 280 |
| Silver Acetylide | $Ag_2C_2$ | 200 |
| Lead Styphnate | $C_6H_3N_3O_9Pb$ | 295 |
| Barium Styphnate | $C_6H_3N_3O_9Ba$ | 285 |
| Silver Nitride | $Ag_3N$ | 155 |
| Tetrazene | — | 200 |
| Diazodinitrophenol (DDNP) | $HOC_6H_3(NO_2)_2N(:N)$ | 180 |

The above three tables are by no means all inclusive. There are many other unstable chemical compounds which may be classified as primary explosives and which, under appropriate conditions of temperature and pressure, might conceivably be utilized for the explosive bonding of miniature workpieces. However, the explosives listed in the above tables are of primary interest in this regard.

Figure 4:
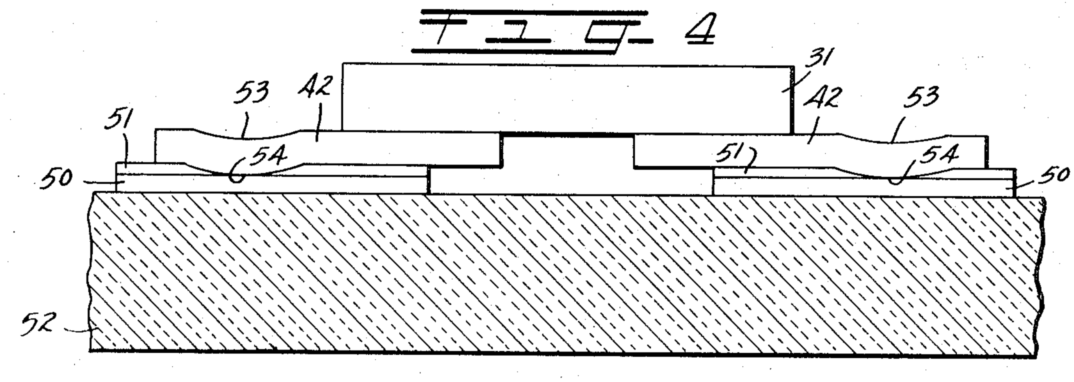
FIG. 4 is a partial, cross-sectional view of the beam-lead device shown in FIG. 3 after it has been explosively bonded to the substrate.

Turning now to FIG. 4, there is shown a cross-sectional view of integrated circuit device 31 prior to its being bonded to the terminal land areas 50 of a ceramic substrate 52. A thin film 51 of grease, dirt, metal oxide, or other contaminants is shown on the upper surface of land areas 50. A similar film will generally also be present on the surface of beam leads 42 but, for the sake of clarity, this film has been omitted from the drawing.

It will be noted that each beam lead is bent upward away from the substrate to form a small angle $\alpha$ with the plane of the substrate. In order for a bond to form between a beam lead and the corresponding land area of the substrate, the explosive charge 48, when detonated, must accelerate the beam lead downward towards the land area with a sufficiently high impact velocity that the resultant impact pressure is of sufficient magnitude to cause substantial plastic flow of the workpieces to be joined. Thus, the yield points of the materials from which the workpieces are fabricated must be considerably exceeded by the impact pressure.

An important aspect of explosive bonding is the phenomenon known as "jetting," that is, the process of material flow which occurs when two metal workpieces strike each other at sufficiently high impact velocity to cause plastic flow of the workpiece metals and the formation of a re-entrant "jet" of material between the workpieces, as shown by the arrows 49 in FIG. 4. The formation of this "jet" of molten material is important to the establishment of a strong bond, as it removes any impurities and oxides which may be present on the surfaces of the workpieces to be bonded and brings freshly exposed, virgin metal surfaces into intimate contact in the high-pressure collision. Notwithstanding the above, some workpiece materials, for example, gold, may be satisfactorily bonded even without the presence of "jetting." This is due to the inherently oxide-free surfaces of these materials. In that event, the angle which is formed between the beam lead and the substrate becomes less critical and in some instances even unimportant.

The impact pressure required to bond a beam lead to the corresponding substrate land area may be calculated from the shock Hugoniot data for the workpiece materials. Once the impact pressure required for bonding is known, the impact velocity may be calculated. This in turn yields the necessary ratio of accelerating explosive charge to metal mass (C/M), hence, the quantity of explosive material required for a given bonding operation.

The desirable jetting phenomenon, however, only occurs if the angle of impact, $\beta$, at the collision point exceeds a certain critical value. Further, there can exist either a stable jetting condition or an unstable jetting condition, the latter being undesirable as it results in a bond of poor quality.

Stable jetting will occur if the collision point at which the two surfaces first meet, travels along the interface with a velocity equal to or greater than the highest signal velocity in either of the two workpiece materials. Table D, below, lists the velocity of sound in several typical metals and, for comparison, Table E, lists the detonation velocity of several typical primary explosives.

TABLE D

VELOCITY OF SOUND IN SEVERAL TYPICAL METALS

| Metal | Velocity (m/sec) |
|---|---|
| Gold | 2030 |
| Silver | 2680 |
| Aluminum | 5000 |
| Platinum | 2800 |

TABLE E

DETONATION VELOCITY OF TYPICAL PRIMARY EXPLOSIVES

| Explosive | Detonation Velocity (m/sec) |
|---|---|
| Lead Azide | 4000 |
| Lead Styphnate | 5000 |
| Mercury Fulminate | 5050 |
| DDNP | 6800 |

If the two workpieces to be bonded are positioned parallel to one another, the collision point velocity equals the detonation velocity of the accelerating explosive charge. It will thus be seen that for the types of metals commonly used for microleads and land areas in the electronics industry, by the choice of an appropriate explosive material, the collision point velocity will always exceed the bulk sonic velocity in the workpiece metals.

Actually, if the collision point velocity substantially exceeds the bulk sonic velocity in the workpiece materials, another undesirable effect is noted. That is, the generation of expansion waves in the workpieces which tend to separate the inner surfaces thereof and destroy or weaken the bond immediately after its formation. The ideal situation is when the collision point velocity slightly exceeds the bulk sonic velocity so that stable jetting occurs, yet undesirable expansion waves do not occur. For parallel geometry, this condition can be achieved by slowing down the detonation velocity of the explosive material, for example, by the addition of inert materials such as liquid paraffin or French Chalk thereto, or by reducing the density of the explosive. For example, the addition of 30 percent liquid paraffin to lead azide will reduce the velocity of detonation from 4,000 m/sec to 500 m/sec, but the mixing process is difficult to control and the results are often unpredictable. For these reasons, other means must be employed to reduce the collision point velocity.

If the workpieces to be bonded are not held parallel, but rather are aligned so that they make a small angle $\alpha$ to one another, the collision point velocity is no longer the same as the detonation velocity of the explosive material, but falls to some fraction thereof. Thus, by varying the geometry of the bonding configuration, the collision point velocity may be adjusted so that it is only slightly more than the bulk sonic velocity in the workpiece materials, which is the optimum condition.

As previously discussed, there is a critical angle of contact $\beta$ for the collision below which jetting and satisfactory bonding usually will not occur. For parallel geometry, $\beta$ can be increased by increasing the ratio of explosive charge to mass (C/M). However, if this is attempted in nonparallel geometry, such as shown in FIG. 4, it is found that the collision point velocity also increases. There is thus an interaction betwen changing the impact angle $\beta$ so that it exceeds the critical angle below which jetting does not occur, and lowering the collision point velocity to approximately the bulk sonic velocity in the workpiece materials. Nevertheless, despite this interaction, for workpieces of the type shown in FIG. 3, and primary explosives of the types listed in Tables A, B, and C, there exists a broad range of orientations, charge densities, and explosive compounds which will simultaneously satisfy all these criteria and produce strong, sound bonds. As an example of a specific bond, which I have produced, according to the methods of this invention, a gold wire measuring 0.002 inch by 0.0005 inch was bonded to a gold-plated ceramic substrate by means of from 25 to 40 $\mu$ grams of lead azide. Detonation was accomplished by an electrical discharge from a 3 volt D.C. source. The wire made an angle of less than 5° to the plane of the substrate. I further discovered that bonding was facilitated if the temperature of the substrate was raised to 175°C prior to passing the electrical discharge through the substrate.

Figure 3:
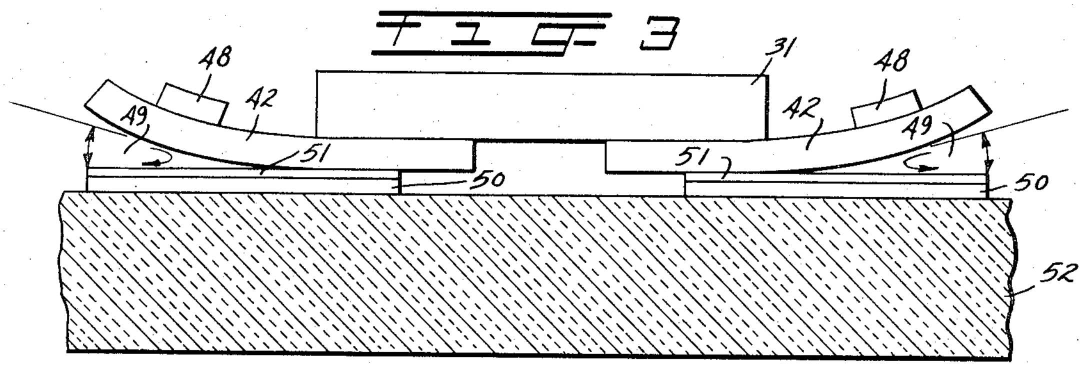
FIG. 3 is a partial, cross-sectional view of a beam-lead device prior to the explosive bonding thereof to the land areas of a substrate.

FIG. 4 depicts the beam-leaded device shown in FIG. 3 after it has been explosively bonded to the substrate. The beam leads 42 are now, of course, flattened and substantially parallel to the substrate. A small area of discoloration or pitting 53 will be noted on each beam lead in the region priorly occupied by explosive material 48. This discoloration and pitting, however, does not affect the mechanical strength or electrical characteristics of the beam leads to any detectable degree.

In the explosive bonding of massive workpieces, the explosive is laid down upon the upper surface of the upper workpiece as a sheet charge. In the methods of my invention, however, the explosive material is not laid down as a sheet charge, but rather as a point charge. Thus, the region 54 in which bonding actually occurs does not extend over the entire area of the beam lead. This is of no great import, however, as it approximates the geometry which occurs in other satisfactory bonding techniques, such as thermocompression or ultrasonic bonding.

As previously mentioned, because of the size of the workpieces and the extremely large quantities of explosive materials employed, conventional explosive bonding is usually performed out of doors. Thus, the unwanted by-products of the explosion are quickly discharged into the atmosphere. Further, in the prior art, the massive workpieces employed are not particularly sensitive to contamination by these by-products. This is not necessarily true, however, of the miniature workpieces contemplated by this invention, particularly integrated circuits and the like. Here, the by-products of the explosion, both gaseous and particulate, pose a very real threat of contamination to the silicon or germanium material from which the active devices in the integrated circuits are fabricated. This contamination may, under certain circumstances, alter the operating characteristics of the devices or, worse, render them totally inoperative. The same is true, to a lesser extent, of thin-film capacitors and resistors which may also be fabricated upon the same substrate. Fortunately, I have discovered that this contamination can, in part, be prevented by conducting the explosive bonding in a partial vacuum, for example, by the use of a conventional bell-shaped vacuum jar. In addition, by removing the air which is normally present between the workpieces, the partial vacuum tends to increase the workpiece acceleration, thereby improving the quality of the bond. As an alternative to the use of a partial vacuum, the explosive bonding may be effected through an intermediate buffer, such as a layer of plastic, for example the polyimide sold under the registered trademark "KAPTON," of the E. I. DuPont de Nemorus Co. Metallic material, for example, stainless steel, or the like, may also be used for the buffer medium.

Figure 5:
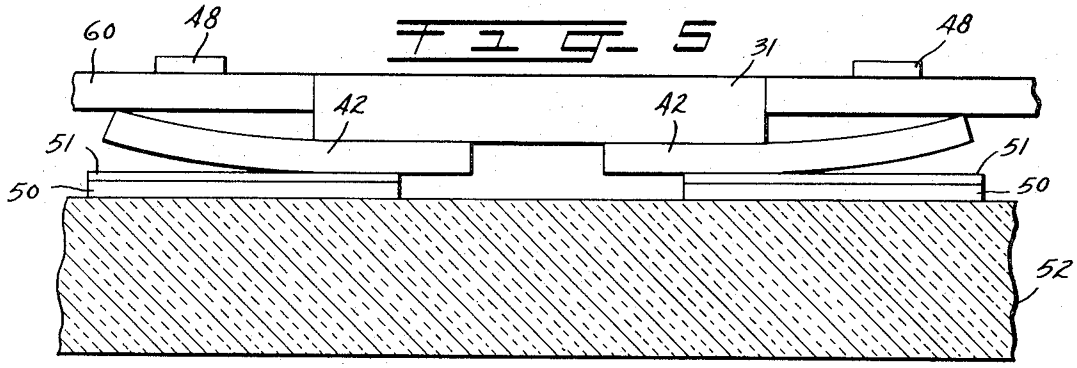
FIG. 5 is a partial, cross-sectional view of the beam-lead device shown in FIG. 3 illustrating the use of a buffer member positioned intermediate the explosive material and the beam-lead device.

FIG. 5 illustrates the use of such a buffer layer in an explosive bonding operation. As shown therein, a film of plastic (e.g., a KAPTON film 3 mils thick) or metallic material (e.g., 303 type stainless steel 2 mils thick) 60 having a plurality of apertures 61 therein is positioned over the top surface of beam-lead device 31. The explosive material 48, which priorly was deposited directly onto the beam leads 42, is now deposited on the upper surface of the film 60. Additionally, if film 60 is plastic and, in addition, transparent, alignment of the explosive charges, with respect to the beam leads of the integrated circuit devices, may be facilitated, for example, by use of the alignment technique disclosed in U.S. patent application, Ser. No. 820,179 of F. J. Jannett, filed on Apr. 29, 1969.

The explosive charges which are deposited onto the buffer film may be placed there by means of a stencil or by the use of a patterned silk-screen or printed onto the film, intaglio fashion, by means of a suitable rubber or metallic roller having a raised surface thereon which corresponds to the desired locations of the explosive charges.

Figure 6:
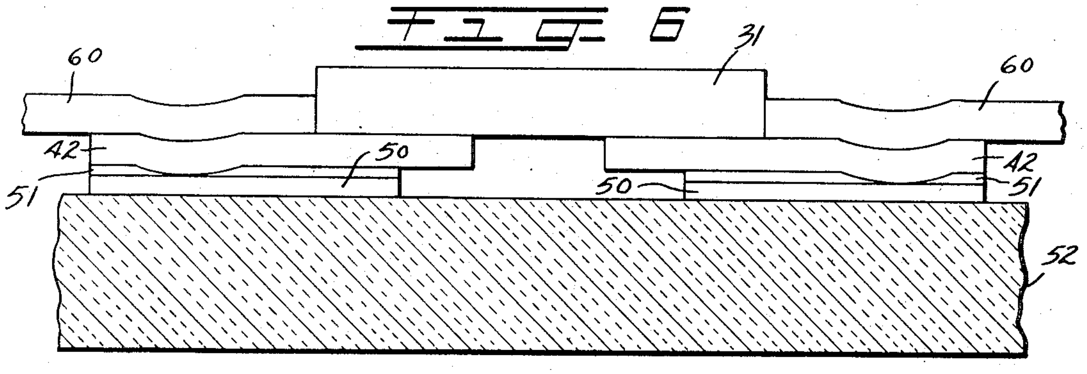
FIG. 6 is a partial, cross-sectional view of the beam-lead device shown in FIG. 5 after explosive bonding to the substrate has occurred.

FIG. 6 depicts the beam-lead device shown in FIG. 5 after the explosive material 48 has been detonated. As was the case illustrated in FIG. 4, the beam leads 42 are now substantially parallel to substrate 52 and bonded to the land areas 50 of the substrate at locations 54. The buffer film 60 is forced down about device 31 by the explosion, but is not ruptured. As a result, unwanted by-products of the explosion are prevented from reaching the sensitive portions of the substrate, and damage thereto is completely avoided. Although in FIG. 6 buffer sheet 60 is depicted as being apertured so that it may be fitted over the beam-lead devices, it will be appreciated that sheet 60 could be contoured, rather than apertured, and in that event would also serve to protect the IC device from contamination as well as the substrate. After the bonding operation has been satisfactorily performed, buffer film 60 may be peeled off the substrate. If the sheet is fabricated from plastic material, however, no deleterious effects will occur if it is permitted to remain in place.

What is claimed is:

1. An article of manufacture which comprises:

a beam lead-like device having a plurality of microleads extending outwards therefrom said microleads having a quantity of explosive material deposited thereon.

2. The article of manufacture according to claim 1, wherein said beam lead-like device comprises:

a semiconductor body having said microleads extending therefrom.

3. The article of manufacture according to claim 1 wherein said beam lead-like device is an integrated circuit body having said microleads extending therefrom.

4. An article of manufacture according to claim 1, wherein said explosive material comprises lead azide suspended in a suitable vehicle.

5. An article of manufacture comprising a beam lead-like device having a plurality of microleads extending outward therefrom, said microleads having undulations fabricated in at least one surface thereof and having a quantity of explosive material deposited on another surface thereof.

6. An article of manufacture comprising a beam lead-like device having a plurality of microleads extending outward therefrom, said microleads having castellations fabricated in at least one surface thereof and having a quantity of explosive material deposited on another surface thereof.

* * * * *